(12) United States Patent
Virolainen

(10) Patent No.: US 10,877,717 B2
(45) Date of Patent: Dec. 29, 2020

(54) METHOD AND APPARATUS FOR PROVIDING A VISUAL USER INTERFACE FOR AUDIO EQUALIZATION

(71) Applicant: Nokia Technologies Oy, Espoo (FI)

(72) Inventor: Jussi Virolainen, Espoo (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 14/055,161

(22) Filed: Oct. 16, 2013

(65) Prior Publication Data

US 2015/0106711 A1    Apr. 16, 2015

(51) Int. Cl.
```
G06F 3/16      (2006.01)
G06F 3/0484    (2013.01)
H03G 5/02      (2006.01)
H03G 5/00      (2006.01)
```
(52) U.S. Cl.
CPC .......... *G06F 3/165* (2013.01); *G06F 3/04842* (2013.01); *H03G 5/005* (2013.01); *H03G 5/025* (2013.01)

(58) Field of Classification Search
CPC ..... G06F 3/04842; G06F 3/165; H03G 5/025; H03G 5/005
See application file for complete search history.

(56) References Cited

U.S. PATENT DOCUMENTS

| | | |
|---|---|---|
| 6,490,359 B1 | 12/2002 | Gibson |
| 7,123,728 B2 | 10/2006 | King et al. |
| 8,249,260 B2 | 8/2012 | Tian |
| 2003/0035555 A1 | 2/2003 | King et al. |
| 2003/0112262 A1* | 6/2003 | Adatia ............ G06F 3/0481 715/716 |

(Continued)

FOREIGN PATENT DOCUMENTS

| | | |
|---|---|---|
| EP | 2 144 242 A1 | 1/2010 |
| WO | WO-2012/160415 A | 11/2012 |

(Continued)

OTHER PUBLICATIONS

Ultrafunk, "pcrecording.com—Ultrafunk Sonitus DirectX Effects Plugins Review", published: May 10, 2000, pcrecording.com, https://web.archive.org/web/20000510035347/http://www.perecording.com/sonitus.htm.*

(Continued)

*Primary Examiner* — Seth A Silverman
(74) *Attorney, Agent, or Firm* — Alston & Bird LLP

(57) ABSTRACT

A method, apparatus and computer program product are provided in order to present an intuitive visual user interface for audio equalization. In the context of a method includes defining at least two locations upon the visual user interface. Each location is associated with a predefined audio equalization characteristic. The method also causes first and second configurable elements to be provided by the visual user interface. Further, the method includes associating an audio equalization characteristic with the first configurable element based upon a location of the first configurable element relative to the at least two locations. The second configurable element provides a visual representation of the audio equalization characteristic based upon the location of the first configurable element.

16 Claims, 15 Drawing Sheets

(56) References Cited

U.S. PATENT DOCUMENTS

| | | | |
|---|---|---|---|
| 2007/0078551 A1* | 4/2007 | Lai | G11B 20/10 700/94 |
| 2012/0051560 A1* | 3/2012 | Sanders | H03G 1/02 381/105 |
| 2012/0063614 A1* | 3/2012 | Crockett | G11B 20/10527 381/98 |
| 2012/0063615 A1 | 3/2012 | Crockett et al. | |
| 2012/0185245 A1* | 7/2012 | Kikuchi | H03G 3/3005 704/225 |
| 2015/0169280 A1* | 6/2015 | Suzuki | H03G 5/025 715/716 |

FOREIGN PATENT DOCUMENTS

| | | | | |
|---|---|---|---|---|
| WO | WO 2012160415 A1 * | 11/2012 | | H04S 1/002 |
| WO | WO 2012/163451 A2 | 12/2012 | | |

OTHER PUBLICATIONS

Ultrafunk, "pcrecording.com—Ultrafunk Sonitus DirectX Effects Plugins Review", published: May 10, 2000, https://web.archive.org/web/20000510035347/http://www.perecording.com/sonitus.htm (Year: 2000).*

TechNorms, "Wondering Whats the Best Music Player on Android? PowerAMP and Winamp Top the Charts", published: Nov. 5, 2011, archived: May 23, 2013, Technorms.com, https://web.archive.org/web/20130523235328/https://www.technorms.com/7289/top-music-player-android (Year: 2011).*

"*Kaoss Pad*;" Wikipedia; dated Oct. 4, 2013; retrieved on Nov. 8, 2013 from <https://en.wikipedia.org/wiki/Kaoss_Pad>.

European Search Report for Application No. 14 18 8959 dated Mar. 6, 2015.

Extended European Search Report from European Patent Application No. 16188420.0 dated Feb. 3, 2017, 11 pages.

* cited by examiner

METHOD AND APPARATUS FOR PROVIDING A VISUAL USER INTERFACE FOR AUDIO EQUALIZATION

TECHNOLOGICAL FIELD

An example embodiment relates generally to the presentation of a visual user interface for audio equalization and, more particularly, to the presentation of a visual user interface having first and second configurable elements that permit an audio equalization characteristic to be established in an intuitive manner.

BACKGROUND

Audio equalization has typically been provided by controlled movement of a plurality of sliders, each of which is associated with a respective frequency band. For example, an audio equalizer may include a plurality of sliders that may be adjusted in order to alter the gain of a respective frequency band. Typically, the plurality of sliders of an audio equalizer are positioned side-by-side with each slider configured to be moved vertically upwardly and downwardly in order to increase and decrease, respectively, the gain of a respective frequency band. Although audio equalizers may have mechanical sliders for adjusting the gain of respective frequency bands, graphical equalizers have a user interface with a plurality of sliders to facilitate interaction therewith.

An audio equalizer that includes a plurality of sliders associated with respective frequency bands may provide suitable control for audio professionals or others with substantial experience with respect to the individual adjustment of the gain of each of a plurality of frequency bands in order to optimize an audio presentation. However, other users may be less familiar with the nuances of audio equalization and, as such, may not be readily able to establish the ideal settings of an audio equalizer for different types of audio presentations, such as different genres of songs or other audio recordings. These other users may find the individual controls for the plurality of different frequency bands to be confusing and, in some instances, may simply set the sliders to one position without any further repositioning of the sliders, regardless of the type of audio recording to be presented.

As described by International Patent Application No. PCT/IB2011/052259, a more intuitive audio equalizer has been developed that permits a user to concurrent set both the audio equalization characteristics and the volume at which an audio recording will be presented. In this regard, a user interface is provided that serves as an audio equalizer. The user interface defines predefined regions having audio equalization characteristics, such as those associated with different genres of music, such as rock, classic, jazz and pop. As such, the selection of a point within a respective region of the user interface will cause a subsequent presentation of an audio recording to be presented with the audio equalization characteristics associated with the respective region. By relying upon the audio equalization characteristics that are associated with the different, a user may adjust the audio equalization characteristics for an audio recording in a more intuitive manner and without having to individually select the gain for a plurality of frequency bands.

BRIEF SUMMARY

A method, apparatus and computer program product are provided in accordance with an example embodiment in order to present an intuitive visual user interface for audio equalization. In accordance with an example embodiment, the method, apparatus and computer program product permit a first configurable element to be positioned upon the visual user interface so as to define the audio equalization characteristics associated therewith. The positioning of the first configurable element may be facilitated in an example embodiment by the definition of a plurality of locations upon that visual user interface that are associated with predefined audio equalization characteristics. The method, apparatus and computer program product of an example embodiment may also permit the audio equalization characteristics associated with the first configurable element to be modified, either by modification of the position of the first configurable element or via a second configurable element that provides a visual representation of the audio equalization characteristics based upon the location of the first configurable element. In at least some instances, following modification of the audio equalization characteristics with the second configurable element, the first configurable element may be relocated upon the visual user interface relative to the locations that have the predefined audio equalization characteristics in order to provide visual feedback to the user regarding the manner in which the audio equalization characteristics have been modified. Thus, the method, apparatus and computer program product of an example embodiment provide an intuitive visual user interface for audio equalization that permits audio equalization characteristics to be readily established and modified.

In an example embodiment, a method is provided that includes causing presentation of a visual user interface for audio equalization. The method may also include determining at least two locations upon the visual user interface. Each location is associated with a predefined audio equalization characteristic. The method of this embodiment also causes first and second configurable elements to be provided by the visual user interface. Further, the method of this embodiment includes associating, with a processor, an audio equalization characteristic with the first configurable element based upon a location of the first configurable element relative to the at least two locations. The second configurable element provides a visual representation of the audio equalization characteristic based upon the location of the first configurable element.

The method of an example embodiment may also include permitting modification of the audio equalization characteristic associated with first configurable element based upon interaction with the second configurable element. The method of this embodiment also includes determining an effect of the modification on the location of the first configurable element and causing a relocation of the first configurable element relative to the at least two locations based upon the effect of the modification. In an example embodiment, the method may cause a relocation of the first configurable element by defining an N-dimensional vector representative of the audio equalization characteristic associated with the first configurable element following the modification thereof. In this embodiment, the method may also cause a relocation of the first configurable element by mapping the N-dimensional vector to a corresponding location upon the visual user interface based upon a similarity of the N-dimensional vector to respective N-dimensional vectors of the at least two locations.

The method of an example embodiment may also include causing an indication describing a behavior of the audio equalization characteristic to be provided by the visual user interface in conjunction with the first configurable element.

The method of an example embodiment may also include permitting modification of the location of the first configurable element relative to the at least two locations and causing the visual representation of the audio equalization characteristic provided by the second configurable element to be correspondingly modified based upon the modification of the location of the first configurable element. The method of an example embodiment may cause presentation of the visual user interface by causing presentation of at least two layers with the first configurable element being provided in one layer and a second configurable element being provided in another layer.

The visual user interface of an example embodiment may include a plurality of basis locations having corresponding N-dimensional vectors. Each N-dimensional vector may be representative of a respective audio equalization characteristic. In this embodiment, the method may cause the first configurable element to be provided by the visual user interface by receiving a selection of the location of the first configurable element. In this embodiment, the method may associate an audio equalization characteristic with the first configurable element by determining an N-dimensional vector that corresponds to the location of the first configurable element based upon a relationship of the location of the first configurable element to one or more basis locations and further based upon the N-dimensional vectors of the one or more basis locations.

In another example embodiment, an apparatus is provided that includes at least one processor and at least one memory including computer program code with the at least one memory and the computer program code configured to, with the processor, cause the apparatus to at least cause presentation of a visual user interface for audio equalization. The at least one memory and the computer program code are also configured to, with the processor, cause the apparatus to determine at least two locations upon the visual user interface. Each location is associated with a predefined audio equalization characteristic. The at least one memory and the computer program code are also configured to, with the processor, cause the apparatus to cause first and second configurable elements to be provided by the visual user interface and to associate an audio equalization characteristic with the first configurable element based upon a location of the first configurable element relative to the at least two locations. The second configurable element provides a visual representation of the audio equalization characteristic based upon the location of the first configurable element.

The at least one memory and the computer program code may be further configured to, with the processor, cause the apparatus of an example embodiment to permit modification of the audio equalization characteristic associated with the first configurable element based upon interaction with the second configurable element. The at least one memory and the computer program code may be further configured to, with the processor, cause the apparatus of this embodiment to determine an effect of the modification on the location of the first configurable element and to cause a relocation of the first configurable element relative to the at least two locations based upon the effect of the modification. The at least one memory and the computer program code may also be configured to, with the processor, cause the apparatus of this embodiment to cause a relocation of the first configurable element by defining an N-dimensional vector representative of the audio equalization characteristic associated with the first configurable element following modification thereof and mapping the N-dimensional vector to a corresponding location upon the visual user interface based upon a similarity of the N-dimensional vector to respective N-dimensional vectors of the at least two locations.

The at least one memory and the computer program code may be further configured to, with the processor, cause the apparatus of an example embodiment to cause an indication describing a behavior of the audio equalization characteristic to be provided by the visual user interface in conjunction with the first configurable element. The at least one memory and the computer program code may be further configured, with the processor, to cause the apparatus of an example embodiment to permit modification of the location of the first configurable element relative to the at least two locations and to cause the visual representation of the audio equalization characteristic provided by the second configurable element to be correspondingly modified based upon the modification of the location of the first configurable element. The at least one memory and the computer program code may also be configured to, with the processor, cause the apparatus of an example embodiment to cause presentation of the visual user interface by causing presentation of at least two layers with the first configurable element being provided in one layer and the second configurable element being provided in another layer.

The visual user interface may include a plurality of basis locations having corresponding N-dimensional vectors. Each N-dimensional vector may be representative of a respective audio equalization characteristic. The at least one memory and the computer program code may be configured to, with the processor, cause the apparatus of this embodiment to cause the first configurable element to be provided by the visual user interface by receiving a selection of the location of the first configurable element. The at least one memory and the computer program code may be configured to, with the processor, cause the apparatus of this embodiment to associate an audio equalization characteristic with the first configurable element by determining an N-dimensional vector that corresponds to the location of the first configurable element based upon a relationship of the location of the first configurable element to one or more basis locations and further based upon the N-dimensional vectors of the one or more basis locations.

In a further embodiment, a computer program product is provided that includes at least one non-transitory computer-readable storage medium having computer-executable program code portions stored therein with the computer-executable program code portions including program code instructions configured to cause presentation of a visual user interface for audio equalization. The computer-executable program code portions also include program code instructions configured to determine at least two locations upon the visual user interface. Each location is associated with a predefined audio equalization characteristic. The computer-executable program code portions also include program code instructions configured to cause the first and second elements to be provided by the visual user interface and program code instructions configured to associate an audio equalization characteristic with the first configurable element based upon the location of the first configurable element relative to the at least two locations. The second configurable element of this embodiment also provides a visual representation of the audio equalization characteristic based upon the location of the first configurable element.

The computer-executable program code portions of an example embodiment may also include program code instructions configured to permit modification of the audio equalization characteristic associated with the first configurable element based upon interaction with the second configurable element. The computer-executable program code portions of this embodiment may also include program code instructions configured to determine an effect of the modification on the location of the first configurable element and program code instructions configured to cause a relocation of the first configurable element relative to the at least two locations based upon the effect of the modification. In this embodiment, the program code instructions configured to cause a relocation of the first configurable element may include program code instructions configured to define an N-dimensional vector representative of the audio equalization characteristic associated with the first configurable element following modification thereof and program code instructions configured to map the N-dimensional vector to a corresponding location in the visual user interface based upon the similarity of the N-dimensional vector to respective N-dimensional vectors of the at least two locations.

The computer-executable program code portions of an example embodiment may also include program code instructions configured to permit modification of the location of the first configurable element relative to at least two locations and program code instructions configured to cause visual representation of the audio equalization characteristic provided by the second configurable element to be correspondingly modified based upon the modification of the location of the first configurable element. The program code instructions that are configured to cause presentation of the visual user interface may also include program code instructions configured to cause presentation of at least two layers with the first configurable element being provided in one layer and the second configurable element being provided in another layer.

The visual user interface may include a plurality of basis locations having corresponding N-dimensional vectors. Each N-dimensional vector may be representative of a respective audio equalization characteristic. In an example embodiment, the program code instructions configured to cause the first configurable element to be provided by the visual user interface may include program code instructions configured to receive a selection of the location of the first configurable element. The program code instructions configured to associate an audio equalization characteristic with the first configurable element may also include, in this embodiment, program code instructions configured to determine an N-dimensional vector that corresponds to the location of the first configurable element based upon a relationship of the location of the first configurable element to one or more basis locations and further based upon the N-dimensional vectors of the one or more basis locations.

In yet another embodiment, an apparatus is provided that includes means for causing presentation of a visual user interface for audio equalization. The apparatus of this example embodiment also includes means for determining at least two locations upon the visual user interface. Each location is associated with a predefined audio equalization characteristic. The apparatus of this example embodiment also includes means for causing first and second configurable elements to be provided by the visual user interface and means for associating an audio equalization characteristic with the first configurable element based upon a location of the first configurable element relative to the at least two locations. The second configurable element provides a visual representation of the audio equalization characteristic based upon the location of the first configurable element.

BRIEF DESCRIPTION OF THE DRAWINGS

Figure 1A:
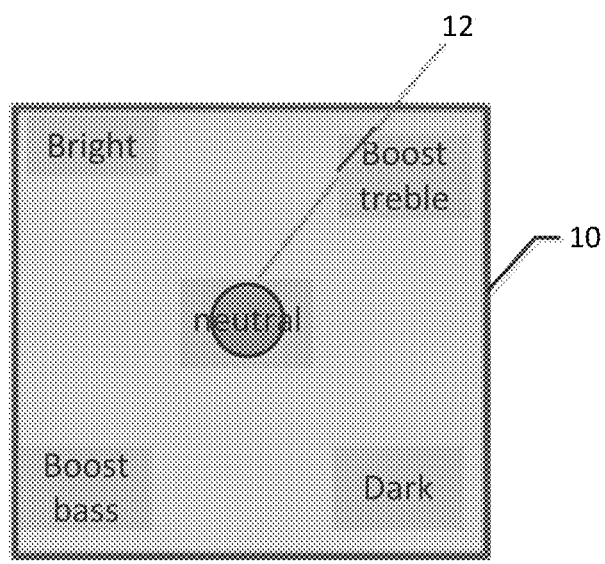
Figure 1B:
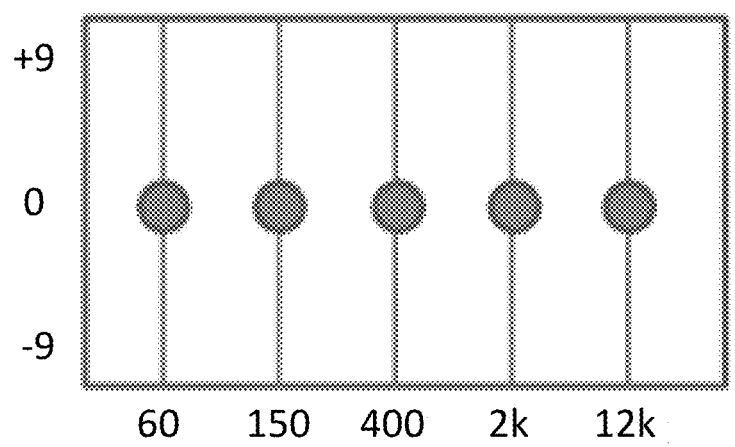
Figure 2A:
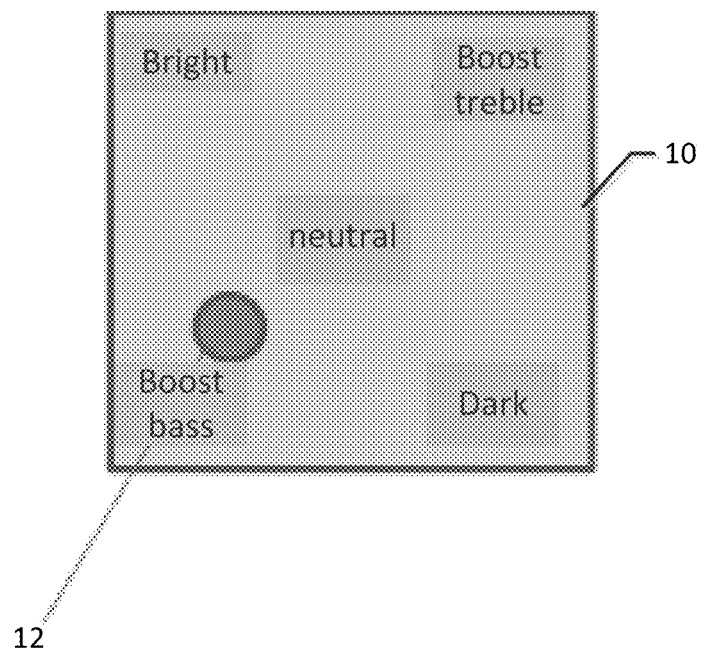
Figure 2B:
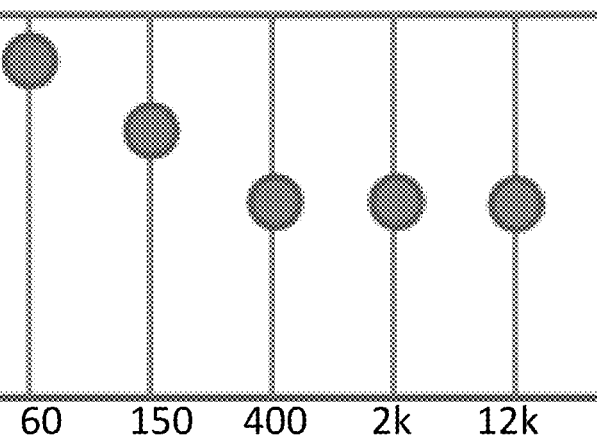
Figure 3A:
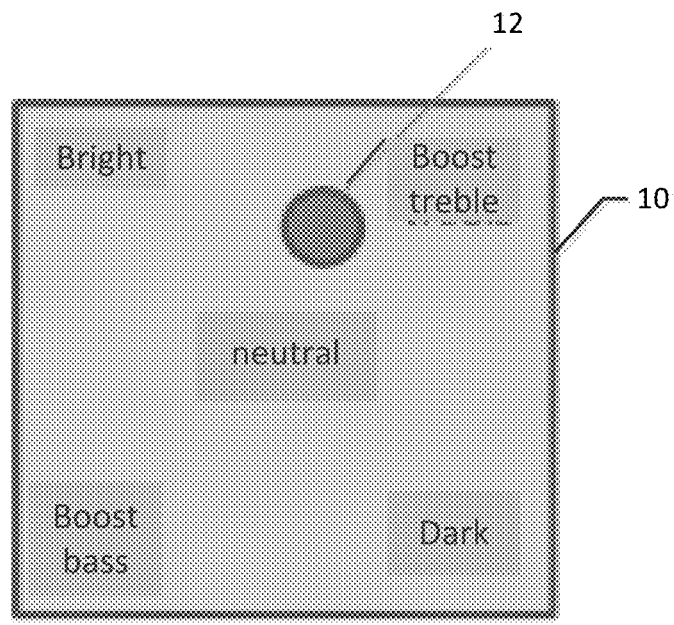
Figure 3B:
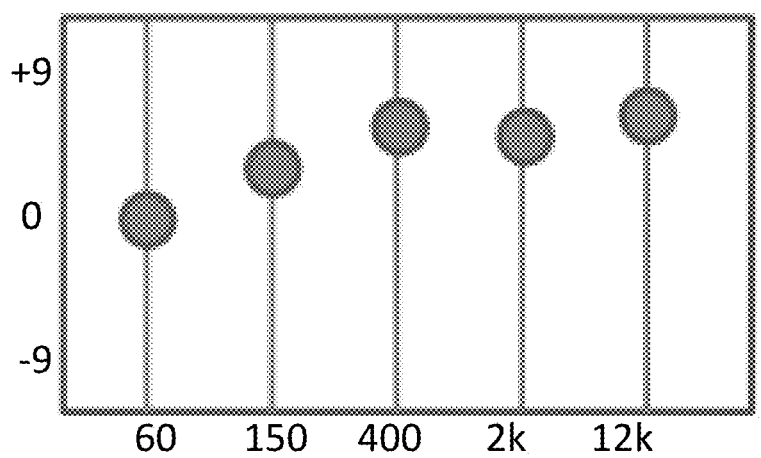
Figure 4:
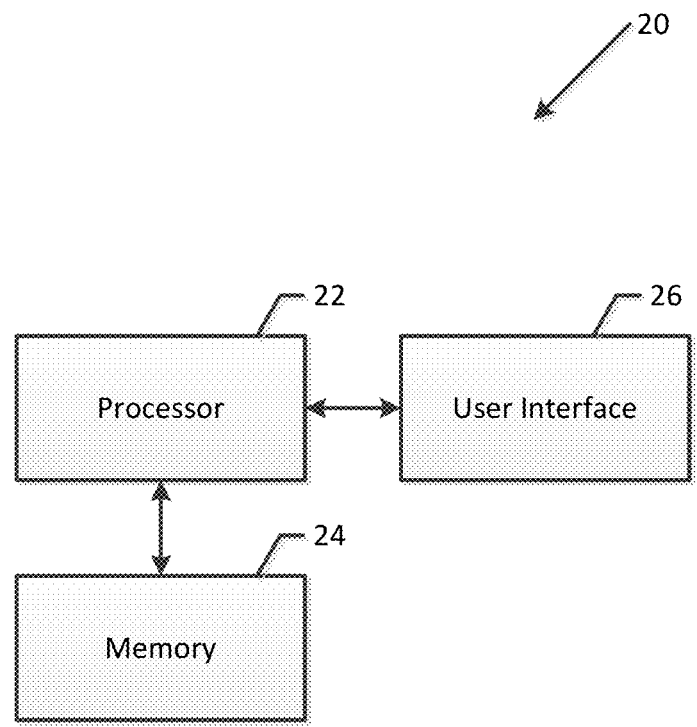
Figure 5:
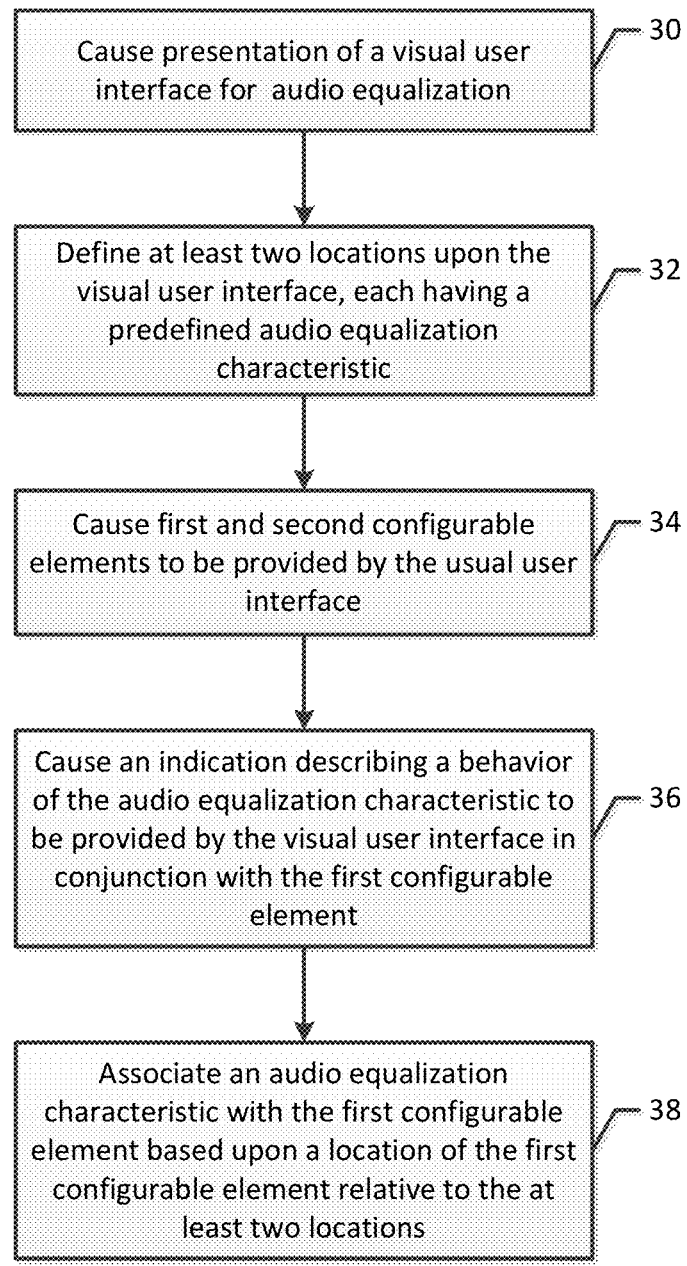
Figure 6:
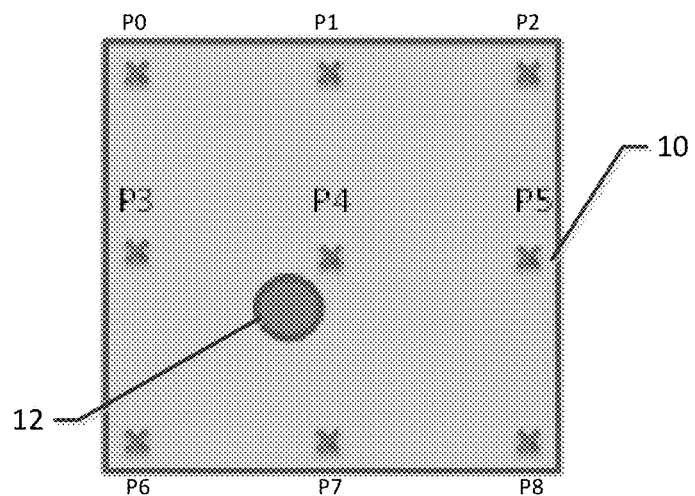
Figure 7:
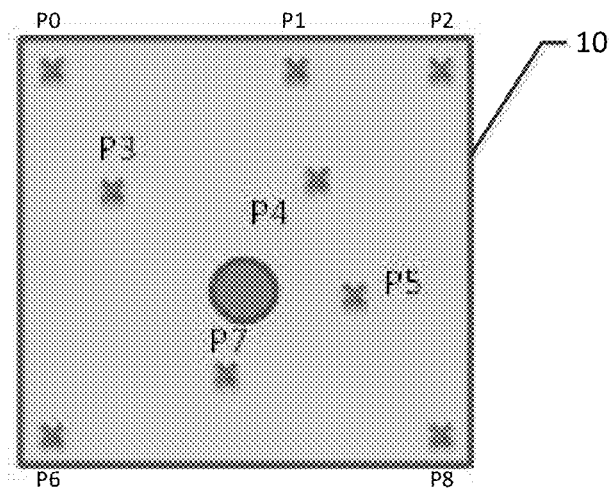
Figure 8:
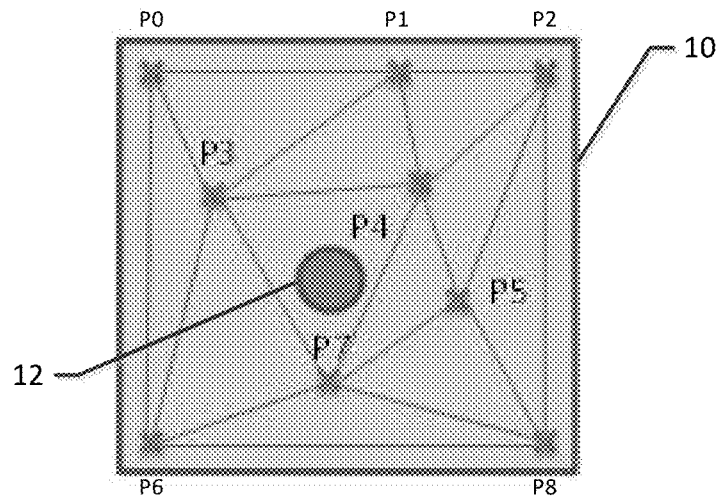
Figure 9:
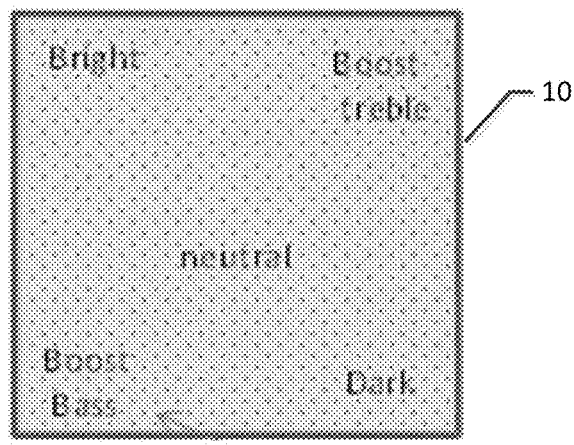
Figure 10A:
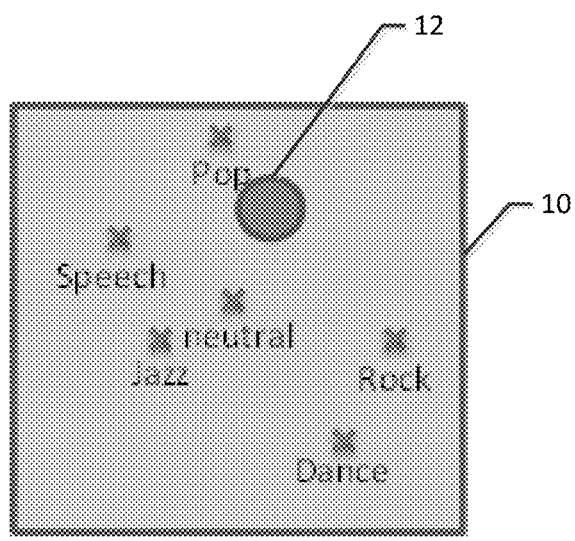
Figure 10B:
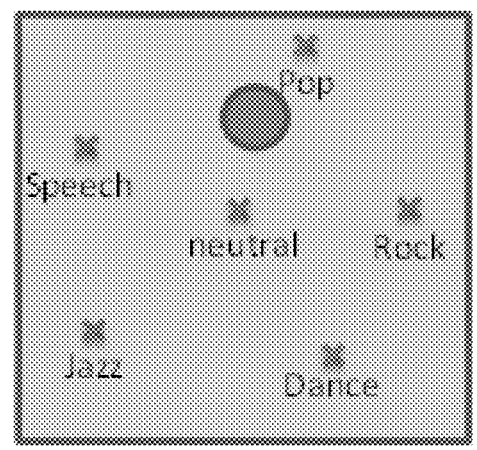
Figure 11:
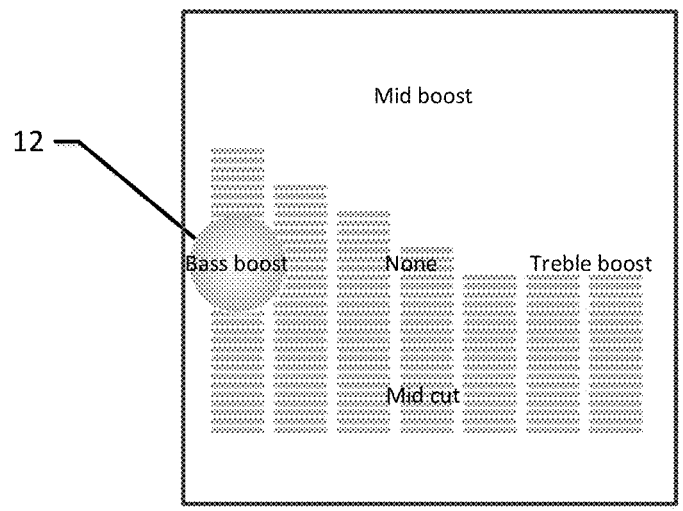
Figure 12:
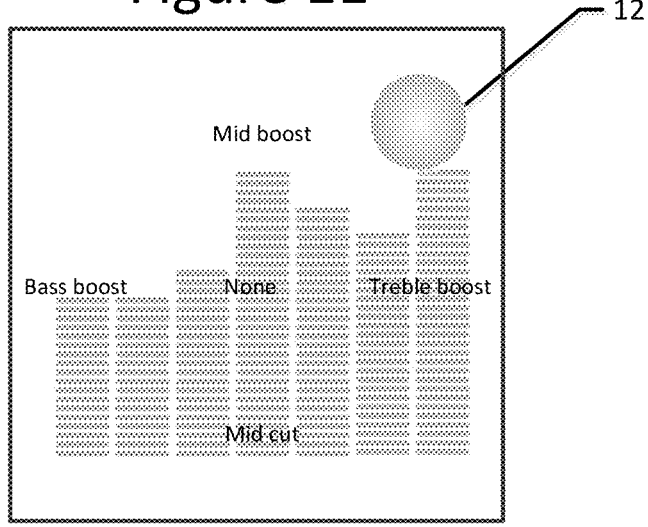
Figure 13:
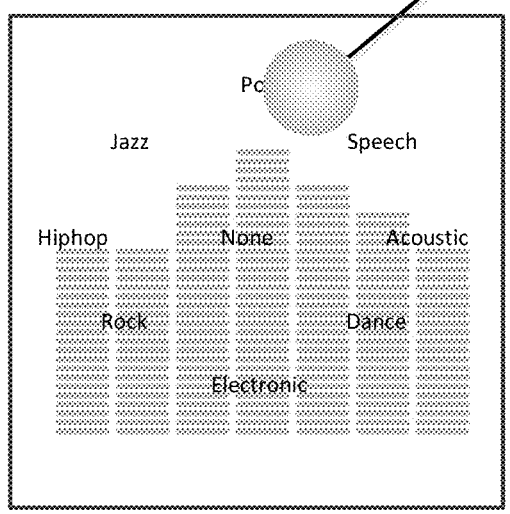
Figure 14:
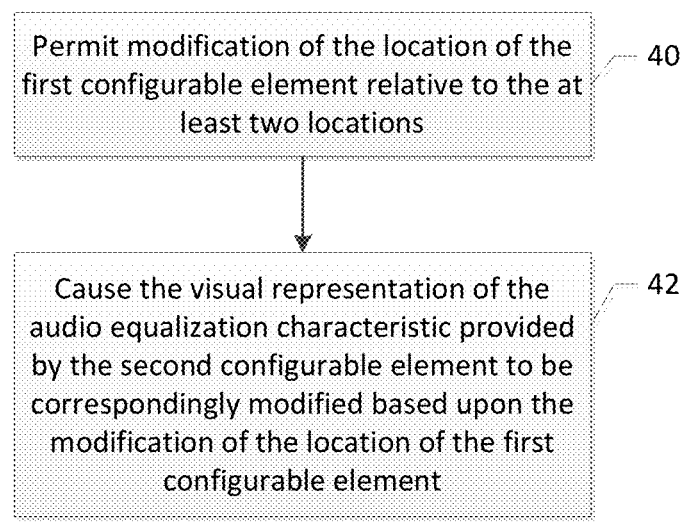
Figure 15A:
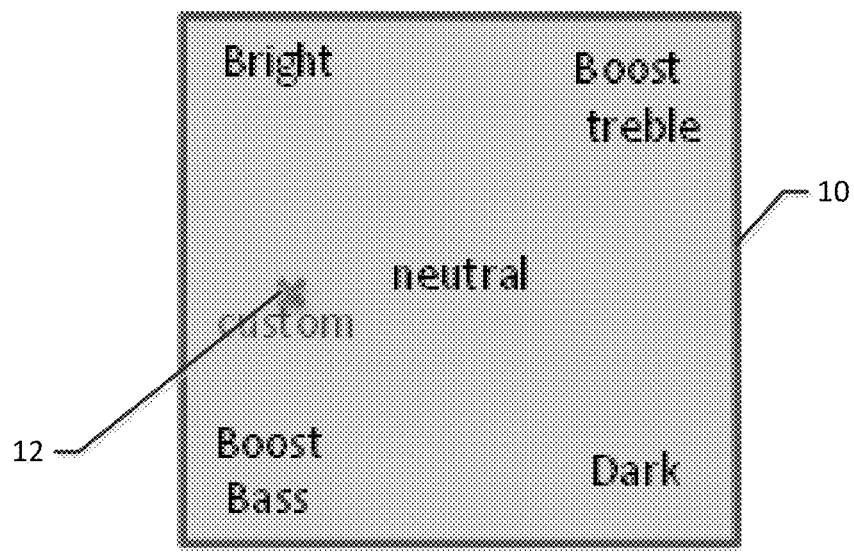
Figure 15B:
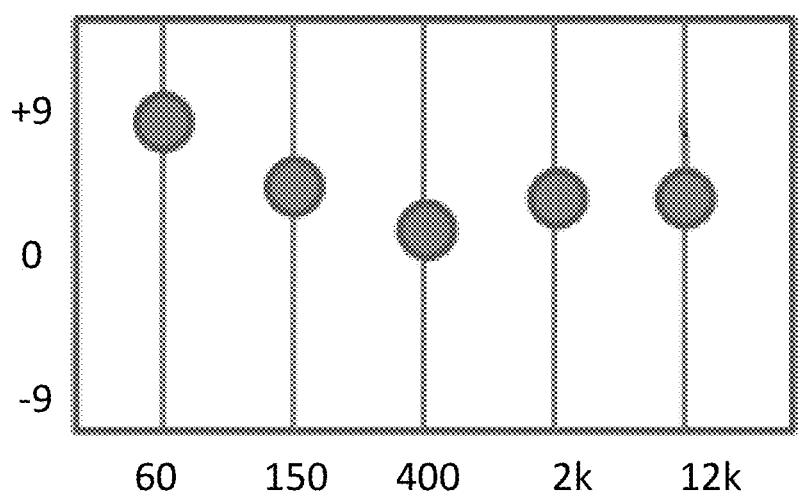
Figure 16A:
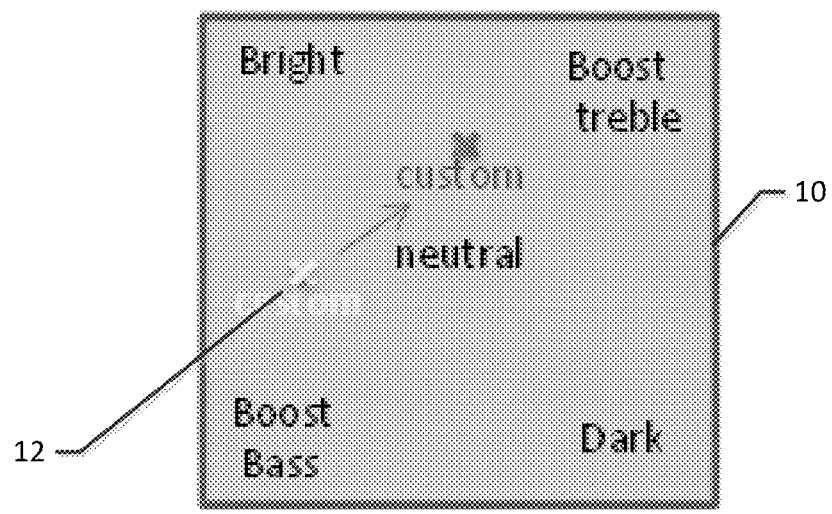
Figure 16B:
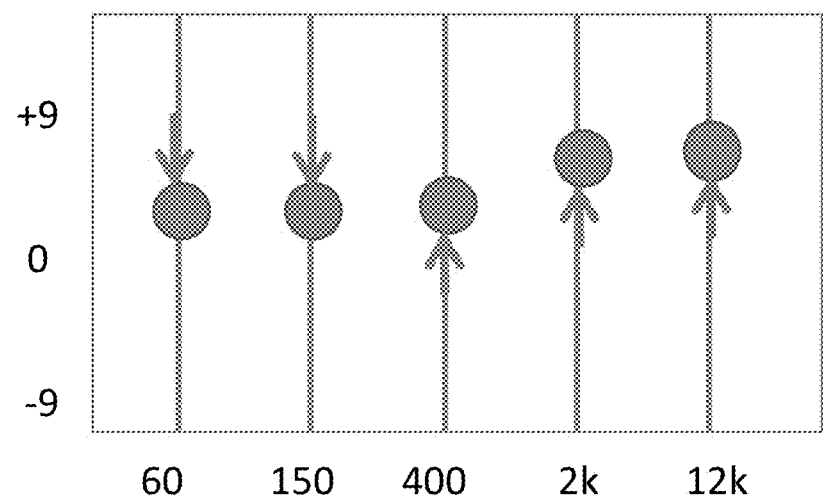
Figure 17:
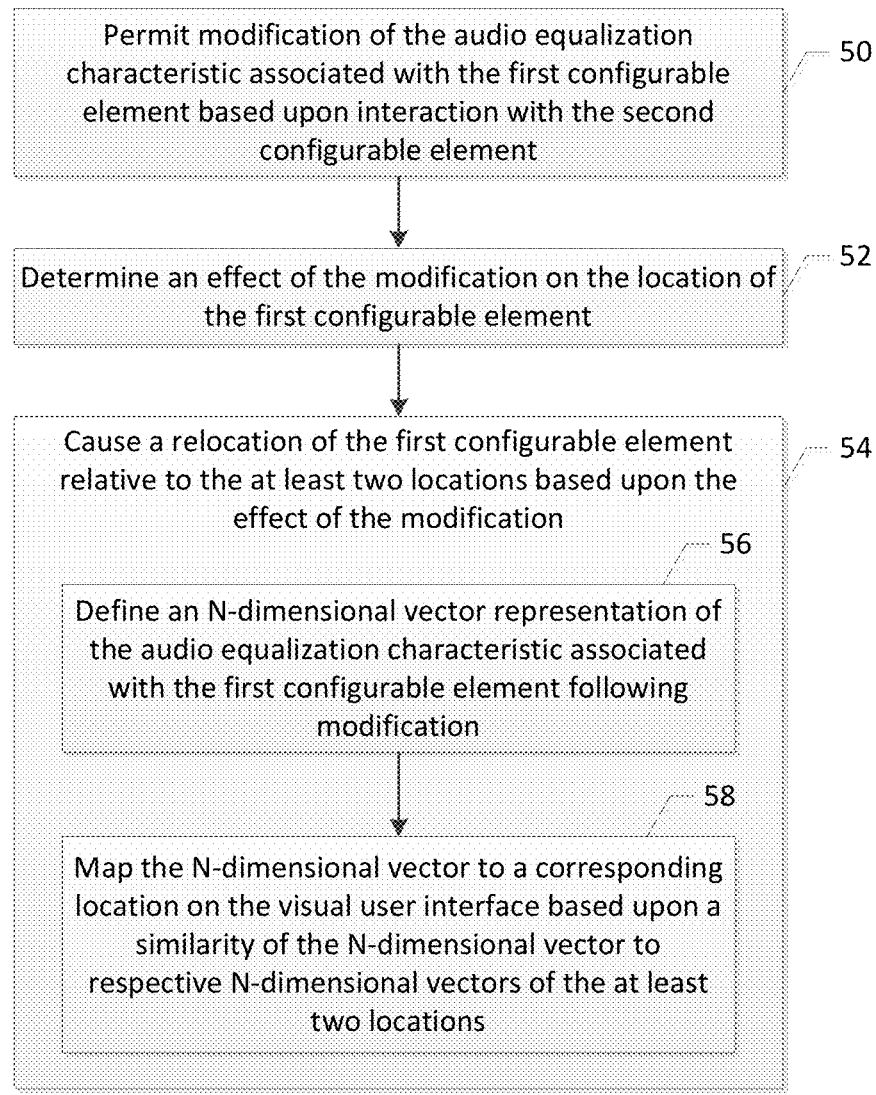
Figure 19A:
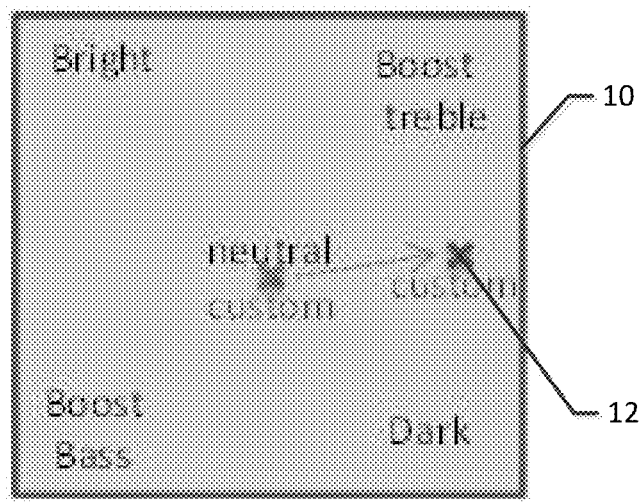
Figure 19B:
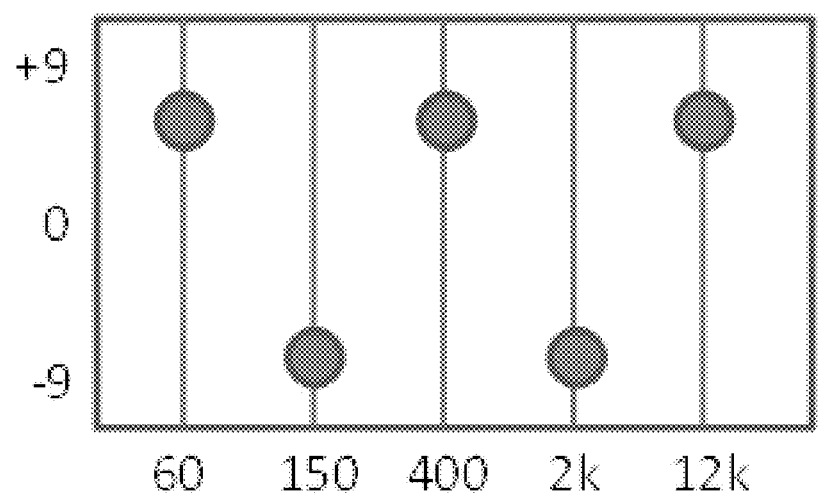

Having thus described example embodiments of the invention in general terms, reference will now be made to the accompanying drawings, which are not necessarily drawn to scale, and wherein:

FIG. 1A is a visual user interface for audio equalization in accordance with an example embodiment of the present invention in which a first configurable element is located at a location having a predefined audio equalization characteristic that is characterized as neutral;

FIG. 1B is a graphical representation of the audio equalization characteristic associated with the first configurable element of FIG. 1A;

FIG. 2A is a visual user interface for audio equalization in accordance with an example embodiment of the present invention in which a first configurable element is located near a location having a predefined audio equalization characteristic that is characterized as boost basis;

FIG. 2B is a graphical representation of the audio equalization characteristic associated with the first configurable element of FIG. 2A;

FIG. 3A is a visual user interface for audio equalization in accordance with an example embodiment of the present invention in which a first configurable element is located near a location having a predefined audio equalization characteristic that is characterized as boost treble;

FIG. 3B is a graphical representation of the audio equalization characteristic associated with the first configurable element of FIG. 3A;

FIG. 4 is block diagram illustrating an apparatus that may be specifically configured in accordance with an example embodiment of the present invention;

FIG. 5 is a flow chart illustrating operations performed, such as by the apparatus of FIG. 4, in accordance with an example embodiment of the present invention;

FIG. 6 is a visual user interface including a plurality of locations having predefined audio equalization characteristics with the locations being uniformly spaced in a sparse grid in accordance with an example embodiment of the present invention;

FIG. 7 is a visual user interface including a plurality of locations having predefined audio equalization characteristics with the locations being arbitrarily spaced in accordance with an example embodiment of the present invention;

FIG. 8 is the visual user interface of FIG. 7 with the addition of imaginary lines that connect the various locations and define the triangles that divide the visual user interface into different regions in accordance with an example embodiment of the present invention;

FIG. 9 is a visual user interface including a plurality of locations having predefined audio equalization characteristics with the locations being uniformly spaced in a dense grid in accordance with an example embodiment of the present invention;

FIG. 10A is visual user interface in which the plurality of locations that are associated with predefined audio equalization characteristics are also associated with different genres of music in accordance with an example embodiment of the present invention;

FIG. 10B is a visual user interface in which the plurality of locations that are associated with predefined audio equalization characteristics are also associated with different genres of music and in which the several of the locations have been heuristically modified relative to FIG. 10A in order to provide further separation between the locations and to improve usability in accordance with an example embodiment of the present invention;

FIG. 11 is a visual user interface that depicts both the first and second configurable elements in accordance with an example embodiment of the present invention;

FIG. 12 is a visual user interface that includes both the first and second configurable elements in which the first configurable element has been moved relative to FIG. 11 and the audio equalization characteristic represented by the second configurable element has correspondingly changed in accordance with an example embodiment of the present invention;

FIG. 13 is a visual user interface that depicts both the first and second configurable elements with the locations associated with predefined audio equalization characteristics being defined in terms of different genres of music in accordance with an example embodiment of the present invention;

FIG. 14 is a flow chart illustrating operations performed, such as by the apparatus of FIG. 4, in accordance with an example embodiment of the present invention;

FIG. 15A illustrates a visual user interface with a first configurable element designated "custom" in accordance with an example embodiment of the present invention;

FIG. 15B illustrates the audio equalization characteristic that is associated with the location of the first configurable element of FIG. 15A;

FIG. 16A illustrates a visual user interface with the location of the first configurable element being modified relative to FIG. 15A in accordance with an example embodiment of the present invention;

FIG. 16B illustrates the audio equalization characteristic that is associated with the location of the first configurable element of FIG. 16A;

FIG. 17 is a flow chart illustrating operations performed, such as by the apparatus of FIG. 4, in accordance with an example embodiment of the present invention;

FIGS. 18A-18D illustrate visual user interfaces that permit modifications to the audio equalization characteristics represented by a second configurable element along with the corresponding relocation of the first configurable element based thereupon in accordance with an example embodiment of the present invention;

FIG. 19A illustrates a visual user interface in which the audio equalization characteristic of a first configurable element is determined to be too dissimilar from the predefined audio equalization characteristics of the plurality of locations defined upon the visual user interface such that the first configurable element is repositioned proximate an edge of the visual user interface in accordance with an example embodiment of the present invention; and FIG. 19B is a graphical representation of the audio equalization characteristic associated with the first configurable element of FIG. 19A.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

As defined herein, a "computer-readable storage medium," which refers to a non-transitory physical storage medium (e.g., volatile or non-volatile memory device), can be differentiated from a "computer-readable transmission medium," which refers to an electromagnetic signal.

A method, apparatus and computer program product are provided in accordance with an example embodiment in order to provide an intuitive visual user interface for audio equalization. By interacting with the visual user interface, a user is able to establish audio equalization characteristics, such as the gain within each of the plurality of frequency bands without having to individually set the gain for each frequency band. An audio equalization characteristic may represent the frequency response for a playback audio system and such frequency response can include one or more ranges of frequencies. The one or more ranges of frequencies may include a flat magnitude (with each frequency having an equal level) or exhibit level dependency in which the frequency response may have a particular shape. Thus, the frequency response may be between a flat response and a non-flat response. The frequency response may be presented by a frequency response curve, in frequency bands or in any other suitable form. As a result of its intuitive nature, the visual user interface that is presented in accordance with an example embodiment of the present invention allows users to tailor the audio equalization characteristics in a manner appropriate for various audio recordings regardless of the level of expertise or experience that the user possesses with respect to audio equalization. Although generally described herein as being represented by the gain associated with each of a plurality of frequency bands, the audio equalization characteristics may be defined in a variety of manners, such as by an equalization curve, level information, frequency information or the like.

By way of example, a visual user interface 10 that may be presented for audio equalization in accordance with one example embodiment is depicted in FIG. 1A. As will be described below, a plurality of locations have been defined upon the visual user interface with each of the locations being associated with a predefined audio equalization characteristic. Additionally, an indication describing the behavior of the predefined audio equalization characteristic may be presented proximate each of the locations. Various types of indications may be employed including the functional indications as represented by FIG. 1A in which the indications associated with the plurality of locations that have predefined audio equalization characteristics are identified as bright, boost treble, dark, boost base and neutral.

By way of example of the predefined audio equalization characteristics associated with the various locations upon the visual user interface 10, a first configurable element 12 may be positioned at the location designated neutral upon the visual user interface. The predefined audio equalization characteristic associated with the location designated neutral is shown in FIG. 1B. In this type of graphical representation, five different frequency bands are represented by the vertical lines with the gain to be provided for signals within each of the respective frequency bands being represented by the circle that is located upon the respective vertical line. With respect to the example depicted in FIG. 1B, the predefined audio equalization characteristic is neutral in that there is no gain applied to signals within any of the frequency bands.

By way of another example, FIG. 2A depicts a visual user interface 10 having the same locations with predefined audio equalization characteristics as in FIG. 1A. However, the first configurable element 12 is no longer positioned upon the location designated neutral, but has been moved closer to the location designated boost bass. The audio equalization characteristic associated with the first configurable element that is now positioned closer to the location designated boost base is shown in FIG. 2B. As will be noted, gain is applied to the lower frequency bands, that is, the frequency bands designated 60 and 150, so as to thereby increase the bass relative to the treble.

By way of a further example, FIG. 3A depicts a visual user interface 10 that includes locations having the same predefined audio equalization characteristics as in FIGS. 1A and 2A. In this example, the first configurable element 12 has again been moved, this time to a position closer to the location designated boost treble. The audio equalization characteristic associated with the first configurable element at a position closer to the location designated boost treble is depicted in FIG. 3B. As will be noted, gain is applied to the higher frequency bands, such as those designated 400 Hz, 2 KHz and 12 KHz, such that the treble is increased relative to the bass.

The presentation of a visual user interface 10 and the definition of the audio equalization characteristic associated with a first configurable element 12 that is provided by the visual user interface may be provided by a variety of different computing devices, including mobile terminals and fixed computing devices. For example, a computing device embodied as a mobile terminal may be a portable digital assistant (PDA), mobile telephone, smartphone, pager, mobile television, gaming device, laptop computer, camera, tablet computer, touch surface, video recorder, audio/video player, radio, electronic book, positioning device (e.g., global positioning system (GPS) device), or any combination of the aforementioned, and other types of voice and text communications systems. Alternative, a computing device embodied as a fixed computing device may be a desktop computer, a personal computer, a workstation or other non-mobile computing device.

Regardless of the type of computing device, the computing device may include or otherwise be associated with an apparatus that is specifically configured to perform the operations to present the visual user interface 10 and to define the resulting audio equalization characteristic to be applied to an audio recording. As shown in FIG. 4, for example, the apparatus 20 may include or otherwise be in communication with a processor 22, a memory device 24 and a user interface 26. In some embodiments, the processor (and/or co-processors or any other processing circuitry assisting or otherwise associated with the processor) may be in communication with the memory device via a bus for passing information among components of the apparatus. The memory device may be non-transitory and may include, for example, one or more volatile and/or non-volatile memories. In other words, for example, the memory device may be an electronic storage device (e.g., a computer readable storage medium) comprising gates configured to store data (e.g., bits) that may be retrievable by a machine (e.g., a computing device like the processor). The memory device may be configured to store information, data, content, applications, instructions, or the like for enabling the apparatus to carry out various functions in accordance with an example embodiment of the present invention. For example, the memory device could be configured to buffer input data for processing by the processor. Additionally or alternatively, the memory device could be configured to store instructions for execution by the processor.

As noted above, the apparatus 20 may be embodied by a computing device. However, in some embodiments, the apparatus may be embodied as a chip or chip set. In other words, the apparatus may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The apparatus may therefore, in some cases, be configured to implement an embodiment of the present invention on a single chip or as a single "system on a chip." As such, in some cases, a chip or chipset may constitute means for performing one or more operations for providing the functionalities described herein.

The processor 22 may be embodied in a number of different ways. For example, the processor may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining and/or multithreading.

In an example embodiment, the processor 22 may be configured to execute instructions stored in the memory device 24 or otherwise accessible to the processor. Alternatively or additionally, the processor may be configured to execute hard coded functionality. As such, whether configured by hardware or software methods, or by a combination thereof, the processor may represent an entity (e.g., physically embodied in circuitry) capable of performing operations according to an embodiment of the present invention while configured accordingly. Thus, for example, when the processor is embodied as an ASIC, FPGA or the like, the processor may be specifically configured hardware for conducting the operations described herein. Alternatively, as another example, when the processor is embodied as an executor of software instructions, the instructions may specifically configure the processor to perform the algorithms and/or operations described herein when the instructions are executed. However, in some cases, the processor may be a processor of a specific device (e.g., a mobile terminal or a fixed computing device) configured to employ an embodiment of the present invention by further configuration of the processor by instructions for performing the algorithms and/or operations described herein. The processor may include, among other things, a clock, an arithmetic logic unit (ALU) and logic gates configured to support operation of the processor.

The apparatus 20 may also include a user interface 26 that may be in communication with the processor 22 to provide output to the user, such as the presentation of the visual user interface 10, and, in some embodiments, to receive an indication of a user input, such as the first and second configurable elements. As such, the user interface may include a display and, in some embodiments, may also include a keyboard, a mouse, a joystick, a touch screen, touch areas, soft keys, one or more microphones, a plurality of speakers, or other input/output mechanisms. In one embodiment, the processor may comprise user interface circuitry configured to control at least some functions of one or more user interface elements such as a display and, in some embodiments, a plurality of speakers, a ringer, one or more microphones and/or the like. The processor and/or user interface circuitry comprising the processor may be configured to control one or more functions of one or more user interface elements through computer program instructions (e.g., software and/or firmware) stored on a memory accessible to the processor (e.g., memory device 24, and/or the like).

Although not shown in FIG. 4, the apparatus 20 of an example embodiment may also include a communication interface that may be any means such as a device or circuitry embodied in either hardware or a combination of hardware and software that is configured to receive and/or transmit data from/to a communications device in communication with the apparatus, such as to facilitate communications with one or more computing devices. In this regard, the communication interface may include, for example, an antenna (or multiple antennas) and supporting hardware and/or software for enabling communications with a wireless communication network. Additionally or alternatively, the communication interface may include the circuitry for interacting with the antenna(s) to cause transmission of signals via the antenna(s) or to handle receipt of signals received via the antenna(s). In some environments, the communication interface may alternatively or also support wired communication. As such, for example, the communication interface may include a communication modem and/or other hardware and/or software for supporting communication via cable, digital subscriber line (DSL), universal serial bus (USB) or other mechanisms.

Referring now to FIG. 5, the operations performed in order to present the visual user interface 10 and to define the audio equalization characteristic to be applied to an audio recording are illustrated. As shown in block 30 of FIG. 5, the apparatus 20 may include means, such as the processor 22, the user interface 26 or the like, for causing presentation of a visual user interface, such as upon a display, for audio equalization. See, for example, FIGS. 1A, 2A and 3A which depict visual user interfaces that may be utilized for audio equalization in accordance with example embodiments. As shown in block 32 of FIG. 5, the apparatus also include means, such as the processor, the user interface or the like, for determining at least two locations upon the visual user interface. Each location is associated with a predefined audio equalization characteristic. By way of example, the locations designated bright, boost treble, dark, boost bass and neutral in the embodiments of FIGS. 1A, 2A and 3A are locations upon the visual user interface that are associated with predefined audio equalization characteristics.

The locations that are associated with predefined audio equalization characteristics may be determined in various manners. In one example embodiment, the locations and the associated predefined audio equalization characteristics may be predefined, such as by being stored in memory 24 so as to be accessible to the processor 22, and may not require any user input. Alternatively, as will be described below in conjunction with the definition and modification of a first configurable element 12, a user may select the location upon the visual user interface 10, such as by touching the location in an embodiment in which the visual user interface is presented upon a touch screen display or by the placement and selection of a cursor at the location. In this embodiment, the user may also provide the audio equalization characteristic that is to be associated with the location, such as by use of the second configurable element as will be described below.

In the embodiments of FIGS. 1A, 2A and 3A as well as subsequent embodiments discussed hereinafter, the locations that are associated with predefined audio equalization characteristics may be visibly presented upon the visual user interface 10. By reference to these visibly depicted locations (and the designations that may be associated therewith), a user may quickly determine the audio equalization characteristics associated with different portions of the visual user interface in order to guide the user in conjunction with the positioning of a first configurable element 12 as will be described below. However, the locations upon the visual user interface that are associated with predefined audio equalization characteristics need not be visible. In embodiments in which the locations are not visible, the locations continue to associate predefined audio equalization characteristics with the particular locations upon the visual user interface.

As shown in block 34 of FIG. 5, the apparatus 20 may also include means, such as the processor 22, the user interface 26 or the like, for causing first and second configurable elements to be provided by the visual user interface 10. Although examples are described hereinafter in which a single first configurable element is provided, the visual user interface may provide a plurality of first configurable elements in other embodiments. In an example embodiment, the first configurable element 12 may be initially positioned by a user who may select a particular position upon the visual user interface, such as by touching the desired position upon a touch screen display that serves as the visual user interface or by placing and selecting a cursor at the desired position upon the visual user interface. In an example embodiment in which the locations that are associated with predefined audio equalization characteristics are visually depicted upon the visual user interface, such as in conjunction with a designation describing the behavior of the associated predefined audio equalization characteristic, the user may position the first configurable element based upon the predefined audio equalization characteristics associated with the other locations such that the first configurable element will have an associated audio equalization characteristic that approximates the audio equalization characteristic that is desired by the user. As shown in FIGS. 1A, 2A and 3A, the first configurable element may be visually represented by the visual user interface, such as by a dot, a cursor or other icon.

As shown in block 38 of FIG. 5, the apparatus 20 may include means, such as the processor 22 or the like, for associating an audio equalization characteristic with the first configurable element 12 based upon a relationship of the location of the first configurable element relative to the at least two locations and further based upon the audio equalization characteristics of the at least two locations. The location of the first configurable element may be coincident with either of the at least two locations or any other location. An audio equalization characteristic may be associated with the first configurable element in various manners. In one embodiment that relies upon truncation, the apparatus, such as the processor, is configured to determine the location that is associated with a predefined audio equalization characteristic that is closest to the location of the first configurable element. In this embodiment, the audio equalization characteristic associated with the first configurable element is defined to be identical to the predefined audio equalization characteristic associated with the closest location to the first configurable element. In the examples depicted in FIGS. 1A, 2A and 3A, the first configurable element is closest to the locations that are associated with predefined audio equalization characteristics that are designated the neutral location, the boost bass location and the boost treble location, respectively.

Alternatively, the apparatus 20, such as the processor 22, may be configured to determine the audio equalization characteristic to be associated with the first configurable element 12 based upon interpolation between the predefined audio equalization characteristics associated with two or more locations that have been defined upon the visual user interface 10. As such, the audio equalization characteristic of the first configurable element may be based upon the predefined audio equalization characteristic of two or more locations that have been defined upon the visual user interface as well as the relative distance of the first configurable element with respect to each of the respective locations.

Interpolation may be performed based upon several locations that are associated with predefined audio equalization characteristics and that have corresponding indications of the behavior of the audio equalization characteristic, such as the locations designated neutral, boost treble, bright, boost bass and dark as shown in FIGS. 1A, 2A and 3A. However, the apparatus 20, such as the processor 22, of an example embodiment may define additional basis locations that are associated with predefined audio equalization characteristics. By having additional basis locations that are associated with predefined audio equalization characteristics, the audio equalization characteristic associated with the first configurable element 12 may be determined in a more granular and, in some instances, a more accurate manner.

In an example embodiment depicted in FIG. 6, a plurality of basis locations are defined so as to be arranged in a grid upon the visual user interface 10 with equal spacing therebetween with each of the locations P0, P1, . . . P8 being associated with a predefined audio equalization characteristic. The audio equalization characteristics associated with these basis locations may be predefined in various manners, but, in one embodiment, may be defined by interpolation (such as described below) relative to the audio equalization characteristics associated with other previously defined locations. As shown in FIG. 7, the basis locations that are defined upon the visual user interface and that are associated with the predefined audio equalization characteristics need not be arranged in a uniform manner as shown in FIG. 6, but may be positioned upon the visual user interface with more arbitrary spacing therebetween. While FIGS. 6 and 7 illustrate a relatively sparse arrangement of basis locations that have been defined upon the visual user interface and that are associated with predefined audio equalization characteristics, an even greater number of basis locations may be defined upon the visual user interface with each basis location associated with a predefined audio equalization characteristic so as to define a dense arrangement or grid of basis locations, such as shown in FIG. 9, thereby permitting the audio equalization characteristic associated with the first configurable element 12 to be determined with even more granularity and, in some instances, even more precision. In some embodiments that employ a dense grid of basis locations, the audio equalization characteristic associated with the first configurable element may be defined by truncation with sufficient precision so as to simplify the requisite processing.

In an instance in which another location that is associated with a predefined audio equalization characteristic is added to the visual user interface by the user after the basis locations have been defined and associated with predefined audio equalization characteristics, the apparatus 20, such as the processor 22, of an example embodiment may be configured to again determine the audio equalization characteristics and/or locations of the basis locations while taking into account the predefined audio equalization characteristic of the newly added location. Thus, the predefined audio equalization characteristic of the newly added location may influence the predefined audio equalization characteristics associated with one or more of the basis locations and/or the locations of the one or more basis locations.

Regardless of the arrangement of basis locations that are defined upon the visual user interface 10 and that are associated with the predefined audio equalization characteristics, the audio equalization characteristics to be associated with the first configurable element 12 may be defined by interpolation, such as by determining the relative location of the first configurable element with respect to a closed shape, such as a triangle, that is defined, such as by Delaunay triangulation, such that at least some of the locations (such as the locations closest to the first configurable element) that are associated with the predefined audio equalization characteristics are the vertices of the closed shape. As shown in FIG. 8, for example, a plurality of triangles may be defined by the locations that are defined upon the visual user interface and are associated with predefined audio equalization characteristics, thereby effectively dividing the visual user interface into a plurality of regions. Although shown in FIG. 8 for purposes of illustration, the closed shapes defined by the locations having predefined audio equalization characteristics are not generally visually presented to the user.

The audio equalization characteristic associated with the first configurable element 12 may then be defined based upon the position of the first configurable element relative to a closed shape. In one embodiment, the first configurable element may be positioned outside of the shape that is to be utilized for purposes of interpolation such that the audio equalization characteristic associated with the first configurable element may be determined by extrapolation. However, the first configurable element may be positioned within the shape that is defined for purposes of interpolation, such as shown with respect to first configurable element 12 which is located within the triangle defined by vertices P3, P4 and P7 in FIG. 8. In one example embodiment, the audio equalization characteristics may be fixed for locations within the closed shape. In another example embodiment, however, the audio equalization characteristics for a location within the closed shape may be defined by interpolation based upon the relative locations and associated audio equalization characteristics of the basis locations that define the vertices of the closed shape.

In regards to the interpolation in which the audio equalization characteristic of a first configurable element 12 are to be determined, the position P(x,y) of the first configurable element within the visual user interface 10 may be defined by x and y coordinates. Conversely, the audio equalization characteristic associated with the first configurable element may be represented by a vector $\overline{Z}$, such as an N-dimensional vector with each dimension of the vector representing the gain associated with a different frequency band. As such, the vector $\overline{Z}$ may be equal to $[z_0, z_1, z_2, \ldots z_N]$ wherein 0, 1, 2, . . . N are the indices k associated with the different frequency bands and $Z_N$ is the value of the gain associated with the $N^{th}$ frequency band. For example, the audio equalization characteristics depicted in FIGS. 1B, 2B and 3B would be represented by a 5-dimensional vector since there are five different frequency bands for which the gain may be adjusted. As such, the apparatus 20, such as the processor 22, may be configured to perform a plane-to-vector mapping to associate the first configurable element that is positioned in the plane defined by the visual user interface to a vector representative of the associated audio equalization characteristic. Thus, a location P(x,y) upon the visual user interface may be mapped to a vector $\overline{Z}$ representative of the audio equalization characteristic associated with the location.

Although interpolation may be performed by the apparatus 20, such as the processor 22, in various manners, one example of the interpolation between predefined audio equalization characteristics in order to define the audio equalization characteristic associated with a first configurable element 12 will be described by way of example. In this embodiment, the positions of three locations upon the visual user interface 10 that are associated with predefined audio equalization characteristics may be represented by $B_0=(x_0, y_0)$, $B_1=(x_1, y_1)$ and $B_2=(x_2, y_2)$. Each location $B_0$, $B_1$ and $B_2$ may be associated with a predefined audio equalization characteristic that may be defined by a vector $\overline{Z}_0$, $\overline{Z}_1$ and $\overline{Z}_2$, respectively. Each of these vectors may include a plurality of values, one of which is associated with the gain for each different frequency band. By way of example, $\overline{Z}_0$ may equal $[z_{00}, z_{01}, z_{02}, z_{03}, z_{04}]$ with 0, 1, 2, 3 and 4 being the index k identifying the respective frequency band. As such, the location designated $B_0$ may be represented in three dimensions as $V_0=(x_0, y_0, z_0)$. Similarly, the other two locations $B_1$ and $B_2$ may be represented in three dimensions as $V_1=(x_1, y_1, z_1)$ and $V_2=(x_2, y_2, z_2)$, respectively. These three non-colinear points $V_0$, $V_1$ and $V_2$ therefore satisfy the following equation:

$$\begin{vmatrix} x-x_0 & y-y_0 & z-z_0 \\ x_1-x_0 & y_1-y_0 & z_1-z_0 \\ x_2-x_0 & y_2-y_0 & z_2-z_0 \end{vmatrix} = 0$$

wherein x and y are the coordinate values of the location of first configurable element and z is the unknown audio equalization characteristic associated with the first configurable element that is to be determined. As such, z may be defined as:

$$z = \left( \frac{(x-x_0)(z_1-z_0)(y_2-y_0) + (y-y_0)(x_1-x_0)(z_2-z_0) - (x-x_0)(y_1-y_0)(z_2-z_0) - (y-y_0)(z_1-z_0)(x_2-x_0)}{(x_1-x_0)(y_2-y_0) - (y_1-y_0)(x_2-x_0)} \right) + z_0$$

This equation may be separately solved for each different dimension, e.g., index k, of the vector. For example, $z_k$ may be defined to represent the $k^{th}$ dimension of the $\overline{Z}$ vector. Consequently, $z_0$, $z_1$ and $z_2$ in the foregoing equation may be replaced by $z_{0k}$, $z_{1k}$ and $z_{2k}$ with the equation thereafter being separately solved for each different value of k, such as k=0, 1, 2, . . . N. As such, the apparatus 20, such as the processor 22, of this example embodiment may be configured to determine the audio equalization characteristic associated with the first configurable element 12 including the gain associated with each different frequency band as defined, for example, by the vector $\overline{Z}$.

As shown in FIGS. 1A, 2A, 3A and 9 and as indicated by block 34 of FIG. 5, the apparatus 20 may also include means, such as the processor 22, the user interface 26 or the like, for causing indications to be provided by the visual user interface 10 in conjunction with the locations that are associated with predefined audio equalization characteristics and/or in conjunction with the first configurable element 12. These indications may describe the behavior of the associated audio equalization characteristic. As show on in FIGS. 1A, 2A, 3A and 9, the designations may be functional, such as bright, boost treble, dark, boost bass, neutral and custom. However, the designations may be defined in other manners, such as by designating respective genres of music as shown, for example, in FIG. 10A with designations for pop, rock, dance, jazz, speech and neutral.

The apparatus 20, such as the processor 22, may be configured to permit the user to relocate the locations that are associated with the predefined audio equalization characteristics. For example, the locations that are defined in the embodiment of FIG. 10A are relatively dense such that it may be somewhat difficult to distinguish between the audio equalization characteristics associated with two or more of the locations in an instance in which the first configurable element 12 is placed therebetween, such as between jazz and neutral. As such, a user may move one or more of the locations so as to further spread the locations apart upon the visual user interface 10 as shown, for example, in FIG. 10B. The apparatus, such as the processor, may be configured to permit the user to move the locations in various manners including by selection of a respective location followed by movement of the location across the visual user interface to a desired destination.

In addition to the first configurable element 12, the apparatus 20, such as the processor 22, the user interface 26 or the like, may be configured to cause a second configurable element to be provided by the visual user interface 10. The second configurable element provides a visual representation of the audio equalization characteristic associated with the first configurable element based upon the location of the first configurable element. The second configurable element may provide various types of visual representations of the audio equalization characteristics. In one embodiment, however, the second configurable element illustrates each different frequency band as well as the relative gain that has been established for the respective frequency bands. As shown in FIG. 11, for example, the second configurable element includes seven vertical columns, each associated with a respective one of the seven different frequency bands. The height of each vertical column is representative of the gain associated with the respective frequency band with taller columns providing more gain and shorter columns providing less gain, e.g., attenuation. As will be understood, the columns may be ordered in terms of increasing frequency from left to right such that the lower frequency bands, e.g., the bass, are on the left hand side and the higher frequency bands, e.g., treble, on the right hand side with the mid-range frequencies positioned therebetween.

As shown in FIG. 11, the first configurable element 12 is co-located with the location designated boost bass. Thus, the vertical bars representative of the lower frequencies, such as those on the left-hand side of FIG. 11, are shown to have a greater gain than the vertical bars on the right-hand side that are representative of treble. As another example, FIG. 12 depicts the first configurable element being positioned between the locations designated mid-boost and treble boost. Thus, the gain associated with each of the different frequency bands is adjusted accordingly as shown in FIG. 12 with the gain associated with the higher, e.g., treble, frequencies and the mid-range frequencies being greater than that of the lower, e.g., bass, frequencies.

The apparatus 20, such as the processor 22, the user interface 26 or the like, may be configured to cause the visual user interface 10 to be presented in two or three dimensions by presenting at least two layers with the first configurable element 12 being provided in one layer and the second configurable element being provided in another layer. The different layers need not be presented or visible at the same time and the apparatus, such as the processor, the user interface or the like, may provide for switching between the different layers. For example, first and second tabs may be associated with the first and second configurable elements, respectively, and may presented upon a display. Upon receiving user selection of one of the tabs, the layer associated with the selected tab may be presented. Alternatively, the visual user interface may concurrently present both the first and second layers of the visual user interface, as shown in FIGS. 11 and 12. In this example embodiment, the element(s) of the top-most layer may be at least partially transparent so as to facilitate the visibility of the element(s) of the underlying layer.

As described above, the layer that includes the first configurable element 12 may also include the locations associated with predefined audio equalization characteristics, which may have corresponding indications that may be defined in various manners, such as functionally as shown in FIGS. 11 and 12, or by genre as shown in FIG. 13. In regards to the embodiment of FIG. 13, the first configurable element is positioned proximate the location designated pop such that the audio equalization characteristic depicted by the second configurable element is established accordingly.

Following the initial positioning of the first configurable element 12 by the user, the user may wish to move the first configurable element, such as to alter the audio equalization characteristic associated therewith. As such, the apparatus 20 of this embodiment may include means, such as the processor 22, the user interface 26 or the like, for permitting modification of the location of the first configurable element relative to the visual user interface 10 and, in particular, the locations that have been defined so as to be associated with predefined audio equalization characteristics. See block 40 of FIG. 14. The location of the first configurable element may be modified in various manners including, for example, selection of the first configurable element followed by a subsequent dragging movement of the first configurable element to a different location upon the visual user interface.

As shown in block 42 of FIG. 14, the apparatus 20 of this embodiment may also include means, such as the processor 22, the user interface 26 or the like, for causing the visual representation of the audio equalization characteristic provided by the second configurable element to be correspondingly modified based upon the modification of the location of the first configurable element 12. With reference to FIG. 15A, for example, a first configurable element may be initially positioned upon the visual user interface 10 to the left of the location designated neutral and relatively intermediate the locations designated bright and boost bass. The corresponding audio equalization characteristic associated with the first configurable element in the position depicted in FIG. 15A is shown in FIG. 15B and may have been determined, for example, by interpolation between the predefined audio equalization characteristics associated with the locations designated bright, neutral and boost bass. As shown in FIG. 16A, the position of the first configurable element may then be moved relative to the initial position shown in FIG. 15A, such as to a location above the location designated neutral and relatively intermediate the locations designated bright and boost treble. In an embodiment in which the visual user interface 10 is provided by a touch screen, the first configurable element may be moved by touching the initial location of the first configurable element and then sliding the user's finger to the new location. Once the location of a first configurable element has been modified, the apparatus, such as the processor, may determine the audio equalization characteristic now associated with the modified location of the first configurable element, such as based upon interpolation between the predefined audio equalization characteristics associated with the locations designated bright, boost treble and neutral. The corresponding audio equalization characteristics associated with the modified location of the first configurable element are shown in FIG. 16B. Thus, a user may modify or other refine the audio equalization characteristic associated with the first configurable element in an efficient and intuitive manner.

Figure 18A:
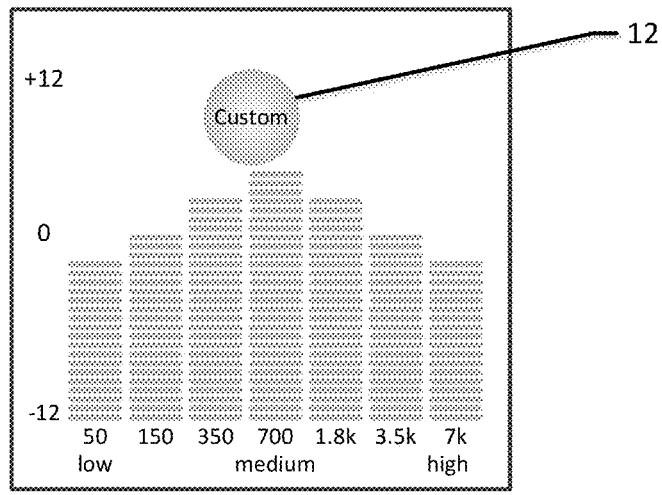
Figure 18B:
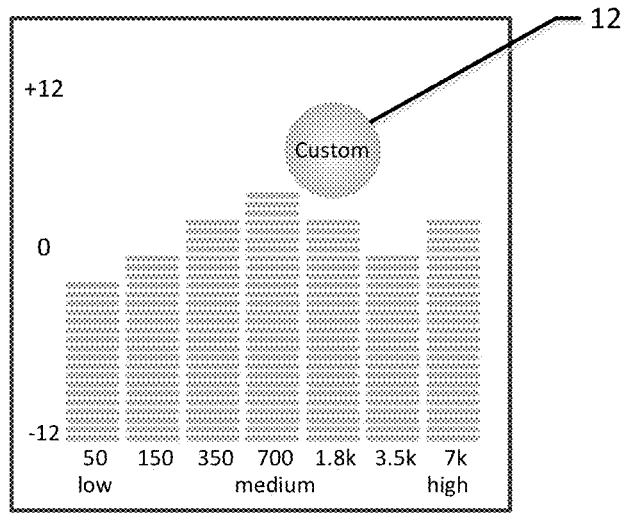

While the audio equalization characteristics associated with the first configurable element 12 may be changed by modifying the location of the first configurable element as described above in conjunction with FIGS. 15A, 15B, 16A and 16B, the audio equalization characteristic associated with the first configurable element may be modified directly utilizing the second configurable element with the corresponding position of the first configurable element then being correspondingly modified, if necessary. In this embodiment as depicted in block 50 of FIG. 17, the apparatus 20 may include means, such as the processor 22, the user interface 26 or the like, for permitting modification of the audio equalization characteristic associated with the first configurable element based upon interaction with the second configurable element. As shown in FIG. 18A, the first configurable element designated custom may initially be positioned in a relatively central location. In FIG. 18B, the user may change the gain provided for at least some of the frequency bands, such as by selecting a respective frequency band and dragging it higher to increase the gain or lower to reduce the gain. However, the user may interact with the second configurable element in other manners in order to modify the audio equalization characteristic in other embodiments. Although the gain may be expressed in various manners, the second configurable element that is depicted in FIGS. 18A and 18B represents gain in a traditional manner, such as with a scale that extends from −12 dB to +12 dB.

The apparatus 20 of this embodiment may also include means, such as the processor 22 or the like, for determining the effect of the modification on the location of the first configurable element 12. See block 52 of FIG. 17. For example, the apparatus, such as the processor, may be configured to determine whether the modification of the audio equalization characteristic would cause a change in the location of the first configurable element that exceeds a predefined threshold. In an instance in which the effect of the modification of the audio equalization characteristic would not cause a change in the position of the first configurable element that exceeds the predefined threshold, the apparatus, such as the processor, may be configured to not alter the position of the first configurable element so as to avoid small changes that may be visually distracting. However, in an instance in which the apparatus, such as the processor, determines that the effect of the modification of the audio equalization characteristic upon the location of the first configurable element would exceed the predefined threshold, the apparatus, such as the processor, may be configured to cause the first configurable element to be relocated.

Figure 18C:
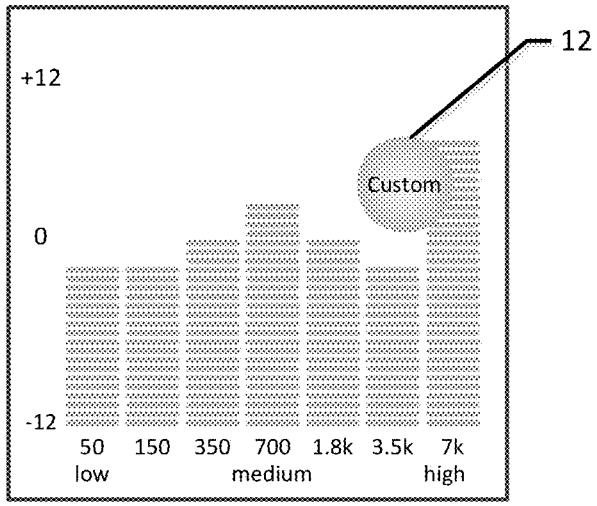

In this regard, the apparatus 20 may include means, such as the processor 22, the user interface 26 or the like, for causing a relocation of the first configurable element 12 relative to the visual user interface 10 and, more particularly, relative to the locations that are defined to be associated with predefined audio equalization characteristics based upon the effect of the modification of the audio equalization characteristic associated with the first configurable element that is brought about through interaction with the second configurable element. See block 54 of FIG. 17. As shown in FIG. 18B, for example, the location of the first configurable element has moved to the right as the audio equalization characteristic associated therewith was modified with an increase in the gain associated with the highest frequency band through interaction with the second configurable element. As shown in FIG. 18C, further modification of the audio equalization characteristic associated with the first configurable element through interaction with the second configurable element, such as by further increasing the highest frequency band and decreasing the lower frequency bands, may cause the first configurable element to be relocated even further to the right.

The manner in which the first configurable element 12 is relocated in response to the modification of the associated audio equalization characteristic may be accomplished in various manners. In one example embodiment, however, the apparatus 20 may include means, such as the processor 22 or the like, for defining an N-dimensional vector representative of the audio equalization characteristic associated with the first configurable element following modification. See block 56 of FIG. 17. In this regard, the interaction with the second configurable element defines the audio equalization characteristic such that an N-dimensional vector may be defined thereupon including, for example, a value associated with the gain for each different frequency band. The apparatus of this embodiment may also include means, such as the processor or the like, for mapping the N-dimensional vector to a corresponding location in the visual user interface 10 based upon a similarity of the N-dimensional vector to respective N-dimensional vectors representative of the predefined audio equalization characteristics associated with the locations upon the visual user interface 10. See block 58 of FIG. 17. Thus, the predefined audio equalization characteristics associated with the respective locations may be similarly represented by respective N-dimensional vectors.

In an example embodiment, the position of a custom preset within the visual user interface 10 may be selected by a user and the audio equalization characteristics for the custom preset may then be modified. In an instance in which similarity mapping is not employed, the position of the custom preset may be considered misdescriptive since the custom present may have audio equalization characteristics, following modification, that are materially different than other basis locations in proximity thereto. By providing for similarity mapping in which the position of the custom preset and/or the basis locations are permitted to be modified as the audio equalization characteristics are correspondingly modified, the custom present may remain in a position that is closest to those basis locations having the most similar audio equalization characteristics.

The apparatus 20, such as the processor 22, may be configured to map the N-dimensional vector representative of the modified audio equalization characteristic associated with the first configurable element to a corresponding location upon the visual user interface 10 in accordance with any of a variety of techniques that consider the similarity of N-dimensional vectors, such as multidimensional scaling (MDS) or a self-organizing map (SOM). In regards to MDS, the first configurable element may be mapped to a corresponding location so as to minimize the errors, e.g., the difference, between the N-dimensional vector associated with the first configurable element and the N-dimensional vectors of the locations associated with predefined audio acoustic characteristic, such as the N-dimensional vectors of the closest locations (or all locations in the plane).

In an example embodiment, a predefined error threshold may be defined. In an instance in which the first configurable element 12 may be mapped to a location such that the errors between the N-dimensional vector associated with the first configurable element and the N-dimensional vectors of the locations closest to the first configurable element satisfy the predefined error threshold, such as by being less than the predefined error threshold, the visual user interface 10 may present the first configurable element at the location to which it was mapped. However, in an instance in which the first configurable element 12 is mapped to a location such that the errors between the N-dimensional vector associated with the first configurable element and the N-dimensional vectors of the locations closest to the first configurable element fail to satisfy the predefined error threshold, such as by being equaling or exceeding the predefined error threshold, the visual user interface 10 may not present the first configurable element at the location to which it was mapped. Instead, the apparatus 20, such as the processor 22 and/or the user interface 26, may be configured to present the first configurable element at a predetermined location indicative of the failure to properly map the first configurable element relative to the other locations. As shown in FIG. 19A, a first configurable element designated custom may have its audio equalization characteristic modified, via the second configurable element as shown in FIG. 19B, from a neutral setting to a setting that differs from those of the other locations by such a degree that the predefined error threshold cannot be satisfied. As such, the first configurable element may be positioned proximate an edge of the visual user interface such that the user is not confused in believing that the audio equalization characteristic of the first configurable element are similar to those of any of the other locations.

For example, similarity, or dissimilarity, may be estimated by a distance function. While a variety of distance functions may be employed, one example of a distance function that determines the Euclidian distance $d_{ij}$ between points $x_i$ and $x_j$ in an N-dimensional space is provided as follows:

$$d_{ij} = \left[\sum_{a=1}^{N}(x_{ia} - x_{ja})^2\right]^{1/2}$$

As such, the apparatus 20, such as the processor 22, may be configured to map the N-dimensional vector that represents the modified audio equalization characteristic associated with the first configurable element 12 so as to minimize the corresponding distance function and to correspondingly locate the first configurable element so as to be closest to the other locations that have the most similar audio equalization characteristics. By mapping the first configurable element based upon similarities between the audio equalization characteristics, the resulting equalization control may have an intuitive feel since similar locations will produce similar audio equalization characteristics and locations that differ significantly in position will produce substantially different audio equalization characteristics. Other distance functions may be utilized to provide for perceptual similarity between equalization characteristics.

Although the foregoing example modifies the location of the first configurable element 12 while the locations associated with the predefined acoustic equalization characteristics remain fixed, the apparatus 20, such as the processor 22, of another embodiment may be configured to additionally or alternatively modify the locations associated with the predefined acoustic equalization characteristics. For example, the locations associated with the predefined acoustic equalization characteristics may additionally or alternatively be modified in an instance in which the modification of the locations associated with the predefined acoustic equalization characteristics permit the distance between the locations in N-dimensional space to be further reduced, thereby further increasing the similarity between neighboring locations.

Figure 18D:
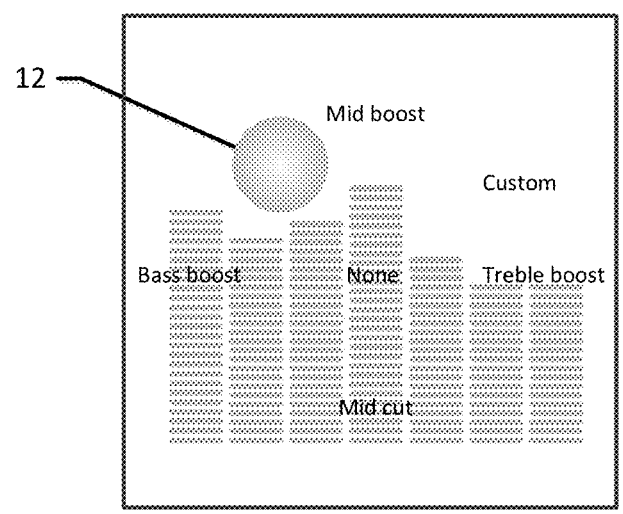

In addition to the first configurable element 12, the layer of the visual user interface 10 that includes the first configurable element may also include the locations that are defined so as to be associated with predefined audio equalization characteristics. These locations may be displayed along with an indication of the behavior of the associated audio equalization characteristic. For example, the indication may be expressed either in terms of functional designations or by genre. Additionally, FIG. 18D depicts an example in which the custom preset of FIG. 18D has been locked in position (as indicated by "Custom") and the first configurable element 12 has then been repositioned. In this example, the audio equalization characteristics associated with the first configurable element have been further modified relative to FIGS. 18A, 18B and 18C based upon the location of the first configurable element, such as toward the left-hand side of the visual user interface 10.

As described above, FIGS. 5, 14 and 17 illustrate flowcharts of an apparatus 20, method and computer program product according to example embodiments of the invention. It will be understood that each block of the flowcharts, and combinations of blocks in the flowcharts, may be implemented by various means, such as hardware, firmware, processor, circuitry, and/or other communication devices associated with execution of software including one or more computer program instructions. For example, one or more of the procedures described above may be embodied by computer program instructions. In this regard, the computer program instructions which embody the procedures described above may be stored by a memory device 24 of an apparatus employing an embodiment of the present invention and executed by a processor 22 of the apparatus. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks.

Accordingly, blocks of the flowcharts support combinations of means for performing the specified functions and combinations of operations for performing the specified functions for performing the specified functions. It will also be understood that one or more blocks of the flowcharts, and combinations of blocks in the flowcharts, can be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. For example, a list of a plurality of audio designations, such as a plurality of genres or other non-genre, audio designations, e.g., bass boost, could be provided with each audio designation having associated audio equalization characteristics. A user may select one or more audio designations from the list and locations upon the visual user interface 10 that are associated with the selected audio designations may be established. For example, the apparatus 20, such as the processor 22, may be configured to map those audio designations that are similar to one another in terms of audio equalization characteristics to locations that are proximate one another and to map those audio designations that are more greatly different from one another in terms of audio equalization characteristics to locations that are further spaced apart from one another, as shown, for example, in FIG. 10A. A user may then manually tune, e.g., alter, the relative locations as shown in FIG. 10B.

Moreover, although the foregoing descriptions and the associated drawings describe example embodiments in the context of certain example combinations of elements and/or That which is claimed:

1. A method comprising:

causing presentation of a visual user interface for audio equalization;

determining at least two locations upon the visual user interface, each location being associated with a predefined audio equalization characteristic having respective predefined gains applied to at least some frequency bands;

causing a first configurable element and a second configurable element to be provided by the visual user interface, wherein the first configurable element is provided in a first layer of the visual user interface and the second configurable element is provided in a second layer of the visual user interface, wherein all configurable elements provided by the visual user interface for audio equalization during display of the first layer are different than all of the configurable elements provided by the visual user interface for audio equalization during display of the second layer, and wherein causing the first configurable element and the second configurable element to be provided comprises switching between the first layer and the second layer such that the first layer and the second layer are not completely displayed at the same time and causing, upon display of the first layer, the first layer to fill the visual user interface for audio equalization, and upon display of the second layer, the second layer to fill the visual user interface for audio equalization;

associating, with a processor, an audio equalization characteristic with the first configurable element based upon a first location of the first configurable element relative to the at least two locations, wherein the audio equalization characteristic associated with the first configurable element defines respective gains applied to each of a plurality of the at least some frequency bands depending on its location such that the first configurable element collectively represents the respective gains of the plurality of frequency bands, wherein the second configurable element provides a visual representation that separately depicts the respective gain applied to each of a plurality of the at least some frequency bands that comprise the audio equalization characteristic based upon the first location of the first configurable element;

changing the visual representation of the second configurable element in response to user interaction with the second configurable element by modifying the respective gain applied to at least one of the plurality of the at least some frequency bands that comprise the audio equalization characteristic visually represented by the second configurable element such that the audio equalization characteristic represented by the second configurable element is different than the respective audio equalization characteristic defined by the first location of the first configurable element;

receiving input causing a relocation of the first configurable element from the first location to a second different location upon the visual user interface of the at least two locations so as to be associated with a different audio equalization characteristic at each location;

changing the visual representation of the second configurable element in correspondence with the relocation of the first configurable element to the second different location by modifying the respective gain applied to each of the plurality of the at least some frequency bands that comprise the audio equalization characteristic visually represented by the second configurable element, wherein the change in the visual representation of the second configurable element is based upon but is in a different direction than the relocation of the first configurable element caused by the input that is received; and using the audio equalization characteristics established by the user interaction with at least one of the first or second configurable element to control a frequency response of a playback audio system.

2. A method according to claim 1 wherein causing a relocation of the first configurable element comprises:

defining an N-dimensional vector representative of the audio equalization characteristic associated with the first configurable element following modification thereof; and mapping the N-dimensional vector to a corresponding location in the visual user interface based upon a similarity of the N-dimensional vector to respective N-dimensional vectors of the at least two locations.

3. A method according to claim 1 further comprising receiving a selection of one or more audio designations having associated audio equalization characteristics, wherein determining the at least two locations upon the visual user interface comprises determining respective locations upon the visual user interface for the one or more audio designations that have been selected based upon the associated audio equalization characteristics.

4. A method according to claim 1 further comprising causing an indication describing a behavior of the audio equalization characteristic to be provided by the visual user interface in conjunction with the first configurable element.

5. A method according to claim 1 wherein causing presentation of the visual user interface further comprises permitting switching of an order in which the at least two layers are presented.

6. A method according to claim 1 wherein the visual user interface includes a plurality of basis locations having corresponding N-dimensional vectors, wherein each N-dimensional vector is representative of a respective audio equalization characteristic, wherein causing the first configurable element to be provided by the visual user interface comprises receiving a selection of the location of the first configurable element; and wherein associating an audio equalization characteristic with the first configurable element comprises determining an N-dimensional vector that corresponds to the location of the first configurable element based upon a relationship of the location of the first configurable element to one or more basis locations and further based upon the N-dimensional vectors of the one or more basis locations.

7. A method according to claim 1 wherein each location upon the visual user interface has a corresponding N-dimensional vector, wherein each N-dimensional vector is representative of the predefined audio equalization characteristic associated with a respective location, wherein causing the first configurable element to be provided by the visual user interface comprises causing the first configurable element to be mapped to the visual user interface based upon a relationship of an N-dimensional vector representative of the audio equalization characteristic associated with the first configurable element to the N-dimensional vectors of the at least two locations.

8. A method according to claim 1 wherein causing the first configurable element and the second configurable element to be provided by the visual user interface comprises causing the first and second configurable elements to be concurrently presented by the visual user interface.

9. An apparatus comprising at least one processor and at least one memory including computer program code, the at least one memory and the computer program code configured to, with the processor, cause the apparatus to at least:
   cause presentation of a visual user interface for audio equalization;
   determine at least two locations upon the visual user interface, each location being associated with a predefined audio equalization characteristic having respective predefined gains applied to at least some frequency bands;
   cause a first configurable element and a second configurable element to be provided by the visual user interface, wherein the first configurable element is provided in a first layer of the visual user interface and the second configurable element is provided in a second layer of the visual user interface, wherein all configurable elements provided by the visual user interface for audio equalization during display of the first layer are different than all of the configurable elements provided by the visual user interface for audio equalization during display of the second layer, and wherein the first configurable element and the second configurable element are caused to be provided by switching between the first layer and the second layer such that the first layer and the second layer are not completely displayed at the same time and such that upon display of the first layer, the first layer fills the visual user interface for audio equalization, and upon display of the second layer, the second layer fills the visual user interface for audio equalization;
   associate an audio equalization characteristic with the first configurable element based upon a first location of the first configurable element relative to the at least two locations, wherein the audio equalization characteristic associated with the first configurable element defines respective gains applied to each of a plurality of the at least some frequency bands depending on its location such that the first configurable element collectively represents the respective gains of the plurality of frequency bands,
   wherein the second configurable element provides a visual representation that separately depicts the respective gain applied to each of a plurality of the at least some frequency bands that comprise the audio equalization characteristic based upon the first location of the first configurable element;
   change the visual representation of the second configurable element in response to user interaction with the second configurable element by modifying the respective gain applied to at least one of the plurality of the at least some frequency bands that comprise the audio equalization characteristic visually represented by the second configurable element such that the audio equalization characteristic represented by the second configurable element is different than the respective audio equalization characteristic defined by the first location of the first configurable element;
   receive input causing a relocation of the first configurable element from the first location to a second different location upon the visual user interface of the at least two locations so as to be associated with a different audio equalization characteristic at each location;
   change the visual representation of the second configurable element in correspondence with the relocation of the first configurable element to the second different location by modifying the respective gain applied to each of at least one of the plurality of the at least some frequency bands that comprise the audio equalization characteristic visually represented by the second configurable element,
   wherein the change in the visual representation of the second configurable element is based upon but is in a different direction than the relocation of the first configurable element caused by the input that is received; and
   use the audio equalization characteristics established by user interaction with at least one of the first or second configurable element to control a frequency response of a playback audio system.

10. An apparatus according to claim 9 wherein the at least one memory and the computer program code are configured to, with the processor, cause the apparatus to cause a relocation of the first configurable element by:
   defining an N-dimensional vector representative of the audio equalization characteristic associated with the first configurable element following modification thereof; and
   mapping the N-dimensional vector to a corresponding location in the visual user interface based upon a similarity of the N-dimensional vector to respective N-dimensional vectors of the at least two locations.

11. An apparatus according to claim 9 wherein the at least one memory and the computer program code are further configured to, with the processor, cause the apparatus to receive a selection of one or more audio designations having associated audio equalization characteristics, and wherein the at least one memory and the computer program code are configured to, with the processor, cause the apparatus to determine the at least two locations upon the visual user interface by determining respective locations upon the visual user interface for the one or more audio designations that have been selected based upon the associated audio equalization characteristics.

12. An apparatus according to claim 9 wherein the at least one memory and the computer program code are further configured to, with the processor, cause the apparatus to cause an indication describing a behavior of the audio equalization characteristic to be provided by the visual user interface in conjunction with the first configurable element.

13. An apparatus according to claim 9 wherein the at least one memory and the computer program code are configured to, with the processor, cause the apparatus to cause presentation of the visual user interface by permitting switching of an order in which the at least two layers are presented.

14. An apparatus according to claim 9 wherein the visual user interface includes a plurality of basis locations having corresponding N-dimensional vectors, wherein each N-dimensional vector is representative of a respective audio equalization characteristic, wherein the at least one memory and the computer program code are configured to, with the processor, cause the apparatus to cause the first configurable element to be provided by the visual user interface by receiving a selection of the location of the first configurable element; and wherein the at least one memory and the computer program code are configured to, with the processor, cause the apparatus to associate an audio equalization characteristic with the first configurable element by determining an N-dimensional vector that corresponds to the location of the first configurable element based upon a relationship of the location of the first configurable element to one or more basis locations and further based upon the N-dimensional vectors of the one or more basis locations.

15. An apparatus according to claim 9 wherein each location upon the visual user interface has a corresponding N-dimensional vector, wherein each N-dimensional vector is representative of the predefined audio equalization characteristic associated with a respective location, wherein the at least one memory and the computer program code are configured to, with the processor, cause the apparatus to cause the first configurable element to be provided by the visual user interface by causing the first configurable element to be mapped to the visual user interface based upon a relationship of an N-dimensional vector representative of the audio equalization characteristic associated with the first configurable element to the N-dimensional vectors of the at least two locations.

16. An apparatus according to claim 9 wherein the at least one memory and the computer program code are configured to, with the processor, cause the apparatus to cause the first configurable element and the second configurable element to be provided by the visual user interface by causing the first and second configurable elements to be concurrently presented by the visual user interface.

* * * * *